United States Patent [19]

Buck

[11] 4,100,479
[45] Jul. 11, 1978

[54] ELECTRONIC MONITORING SYSTEM WITH ZENER DIODE TO CONTROL CAPACITOR CHARGING CURRENT

[76] Inventor: Robert Buck, Kirchbühlweg 128, 7995 Neukirch, Germany

[21] Appl. No.: 786,805

[22] Filed: Apr. 12, 1977

[30] Foreign Application Priority Data

Apr. 13, 1976 [DE] Fed. Rep. of Germany ....... 2616265

[51] Int. Cl.$^2$ ........................................... H01H 36/00
[52] U.S. Cl. ................................. 323/19; 307/252 A; 323/22 Z; 340/562; 323/1
[58] Field of Search ........................ 323/1, 4, 19, 22 R, 323/22 Z, 22, 5 C; 331/109, 65; 307/252 A, 252 J, 252 P, 237; 340/282, 258 R, 258 B, 258 C; 320/1

[56] References Cited

U.S. PATENT DOCUMENTS

| | | | |
|---|---|---|---|
| 3,932,803 | 1/1976 | Buck | 323/19 |
| 4,002,929 | 1/1977 | Suemasa et al. | 307/252 J |

Primary Examiner—Gerald Goldberg
Attorney, Agent, or Firm—Karl F. Ross

[57] ABSTRACT

A contactless motion detector, such as an oscillator sensitive to an approaching metallic element, is connected across a storage capacitor which can be charged from a source of pulsating direct current through a constant-current unit. A Zener diode, shunting the storage capacitor and part of the constant-current unit in series therewith, throttles the flow of charging current through that unit when the capacitor reaches a predetermined charging voltage. Connected across the series combination of storage capacitor and constant-current unit is an ancillary thyristor, triggerable by the detector, forming part of a firing circuit for a main thyristor in parallel therewith; that firing circuit further includes another Zener diode and a stabilizing resistor in series with the ancillary thyristor. Conduction of the main thyristor, upon the triggering of the ancillary thyristor, reduces to near-zero the resistance in series with a load, such as a relay, which is traversed by the current drawn from the source. With both thyristors cut off between pulsations of the source current, the storage capacitor is briefly recharged through a decoupling diode upon a retriggering of the ancillary thyristor before the firing of the main thyristor.

10 Claims, 5 Drawing Figures

ELECTRONIC MONITORING SYSTEM WITH ZENER DIODE TO CONTROL CAPACITOR CHARGING CURRENT

CROSS-REFERENCE TO RELATED APPLICATION

This application discloses subject matter described and claimed in my copending application Ser. No. 782,400 filed Mar. 29, 1977.

FIELD OF THE INVENTION

My present invention relates to an electronic monitoring system, as used for example in a proximity sensor, wherein a preferably contactless detector, sensitive to an ambient condition, generates an output signal which varies with a change in that condition, e.g. with the approach of a metallic element, to increase (or decrease) the current flow through a load designed to indicate such change.

BACKGROUND OF THE INVENTION

Such a monitoring system has been described in my prior U.S. Pat. Nos. 3,747,010, 3,747,011, 3,747,012, 3,919,661, 3,932,774, 3,932,803 and 3,935,542. As particularly disclosed in U.S. Pat. No. 3,932,803, the contactless motion detector may comprise an oscillator and an associated trigger amplifier whose energizing circuit includes a storage capacitor which is charged via a two-conductor supply network from a source of pulsating direct current by way of a constant-current unit in parallel with the anode/cathode path of an output thyristor. In one embodiment of the system described and claimed in the latter patent, the output thyristor and the constant-current device lie in series with an ancillary thyristor which shunts the storage capacitor and is separated therefrom by a decoupling diode. When the output thyristor is triggered by a signal from the oscillator, the ancillary thyristor is fired through a Zener diode inserted between its anode and its gate; thus, the two series-connected thyristors conduct simultaneously in series with a load such as a relay whose operated (or unoperated) state indicates an abnormal condition, e.g. the fact that the oscillator has detected the approach of a metallic element.

Though the system just described operates generally satisfactorily, a drawback resides in the fact that the load is energized through a resistance representing the sum of the resistances of the two series-connected thyristors in their conductive state. To eliminate this drawback, I have disclosed in my above-identified copending application Ser. No. 782,400 an improved system in which the resistance in series with the load is still further reduced in its high-current phase to increase the sensitivity of the system. According to that improvement there is provided a first electronic control device having a pair of main electrodes respectively tied to the leads of the supply network and further having an input electrode, or gate, connected to one of its main electrodes (i.e. its anode if that control device is a thyristor or similar binary electronic switch such as a triac) through an operating circuit which includes a second electronic control device with input connections to the detector for changing the conductivity of the first control device in response to variations in the output signal of that detector, thereby modifying the energization of the load. Thus, the current flow through the load in a state of high conductivity of the first control device is limited practically exclusively by the resistance of that one device (aside from the internal resistance of the current source which preferably, as in the systems of my prior patents, includes a full-wave rectifier). Instead of binary electronic switches such as thyristors I may also use analog-type current regulators such as transistors establishing an entire gamut of energization rates in lieu of just a switchover between "on" and "off" states. Furthermore, the active component of the detector need not be an oscillator but could be an impedance bridge, a field plate or any of a variety of electromagnetic, photoelectric or other transducers responding to a predetermined change of an external condition to be monitored.

The storage capacitor insuring the continued energization of the detector, regardless of the state of conductivity of the electronic control devices, is connected across the leads of the supply network in series with a current-limiting device, more specifically a constant-current unit as in my prior U.S. Pat. No. 3,932,803. A decoupling diode is inserted between the storage capacitor and the ancillary thyristor (or other electronic switch constituting the aforementioned second control device), triggerable by the detector, activating the main thyristor (or other electronic switch representing the first control device) whose condition raises the load current to its maximum value. The operating circuit lying between the anode and the gate of the main thyristor advantageously includes an impedance, preferably an electronic breakdown device such as a Zener diode, delaying the firing of the main thyristor after the ancillary thyristor has been triggered. During this brief delay period, the conduction of the ancillary thyristor recharges the storage capacitor through the decoupling diode while the constant-current unit is practically short-circuited by that conduction. A stabilizing resistor inserted between the gate and the cathode of the main thyristor lies in series with the aforedescribed operating circuit to limit the flow of gate current in that thyristor. The firing of the main thyristor virtually short-circuits the series combination of ancillary thristor, Zener diode and stabilizing resistor so that the latter thyristor ceases to conduct. With pulsating or raw-rectified current supplied by the source, the main thyristor is also cut off at the end of each pulsation during which it has been rendered conductive; this results in a periodic recharging of the storage capacitor at the beginning of each new half-cycle (or full cycle in the case of half-wave rectification).

In the system just referred to, as well as in those of my prior patents wherein a storage capacitor shunted by a charge-limiting electronic breakdown device such as a Zener diode is charged through a constant-current unit, the breakdown device draws practically the full output current of the constant-current unit upon becoming conductive when the storage capacitor reaches a predetermined threshold voltage. This current flow is generally considerably greater than would be necessary in order to maintain conduction of the breakdown device until the capacitor charge has decayed below the sustaining level. It therefore constitutes a wasteful expenditure of energy and may also lead to objectionable heating of the load which lies effectively in series with the breakdown device. In a binary switching system, in which the load is to be in a state of minimum energization when the main or output thyristor is cut off, the existence of a large load current in the quiescent state is especially undesirable.

OBJECT OF THE INVENTION

The object of my present invention, therefore, is to provide an improved electronic switching system of the general type discussed above in which the sustaining current drawn by a conductive charge-limiting electronic breakdown device is minimized.

SUMMARY OF THE INVENTION

A system of the general type described and claimed on my prior U.S. Pat. No. 3,932,803 is modified, in accordance with my present invention, by connecting an electronic breakdown device such as a Zener diode between one of the output leads of the direct-current source, i.e. a lead which has an extension included in the energizing circuit for the motion detector, and a control input of a constant-current unit normally supplying charging current to a storage capacitor in series therewith, this Zener diode being nonconductive as long as the charging voltage of the capacitor lies below a predetermined level. When that level is reached, the voltage across the Zener diode equals its breakdown threshold whereupon that diode conducts and establishes a reference potential which, together with the rising capacitor voltage, throttles - possibly down to complete cutoff - the flow of charging current into the capacitor while drawing a reduced sustaining current from a section of the constant-current unit which lies between that control unit and the other lead of the d-c source.

As disclosed in my prior U.S. Pat. No. 3,932,803, a constant-current unit for the charging of a storage capacitor in the presence of widely varying supply voltages (ranging, for example, between 40 and 250 V) comprises two parallel impedance branches, one of these branches including a transistor serving as an analog-type current regulator while the other branch comprises a voltage divider with a tap tied to the base of this current-regulating transistor. Pursuant to a more specific feature of my present invention, this tap constitutes the aforementioned control input of the constant-current unit whereby the sustaining current for the charge-limiting Zener diode is drawn only through one or more resistors forming part of the voltage divider; with the emitter of this transistor connected to the storage capacitor (usually through a resistance), this emitter-follower connection progressively reduces the conductivity of the transistor once the Zener threshold has been exceeded.

In an advantageous embodiment, incorporating features disclosed in my copending application Ser. No. 782,400 referred to above, the storage capacitor is provided with an ancillary charging circuit including a decoupling diode through which that capacitor is connected in series with the thyristor or other binary switch representing the aforementioned second control device.

BRIEF DESCRIPTION OF THE DRAWING

The above and other features of my invention will now be described in detail with reference to the accompanying drawing in which.

SPECIFIC DESCRIPTION

Figure 1:
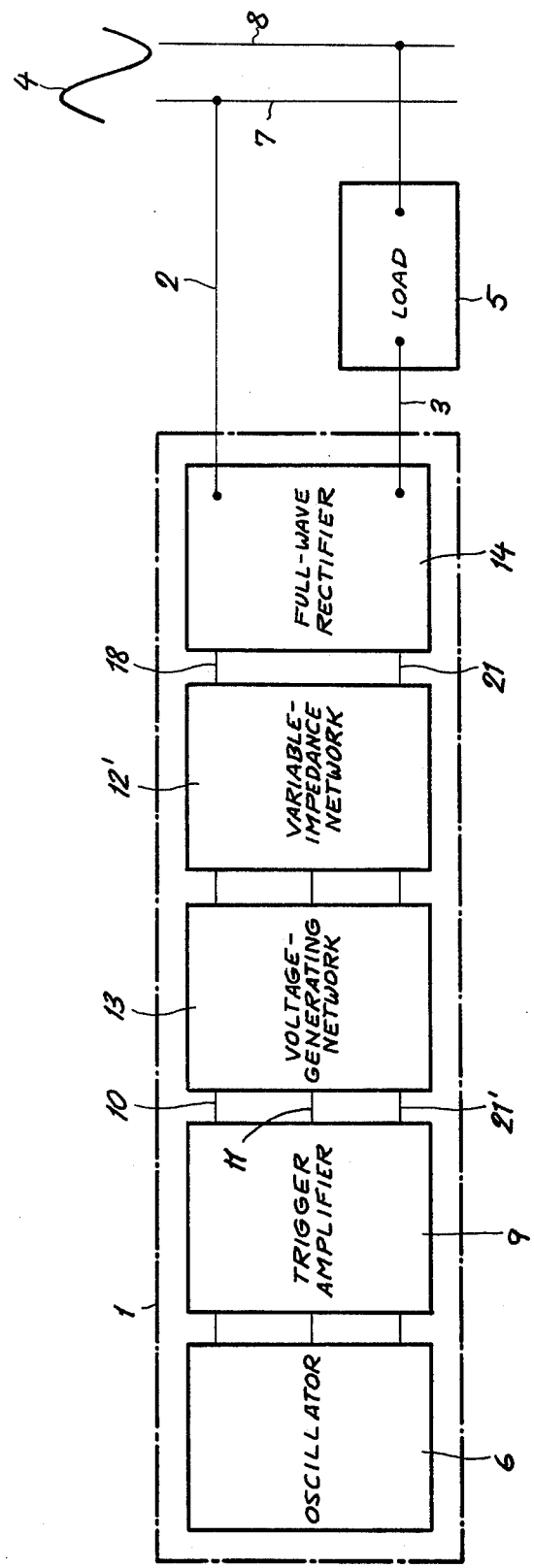
FIG. 1 is a block diagram of an electronic monitoring system according to my invention.

FIG. 1 shows the basic components of a monitoring system embodying my invention, namely an oscillator 6 and a trigger amplifier 9 together constituting a detector, a current-responsive load 5 such as a relay in a supply circuit whose two conductors 2, 3 are connected via respective bus bars 7, 8 across an a-c source 4, a full-wave rectifier 14 inserted between the supply conductors 2, 3 and a pair of leads 18, 21 extending to a variable-impedance network 12' whose impedance controls the load current in response to signals from oscillator 6, and a voltage-generating network 13 also receiving the output of rectifier 14 by way of leads 18 and 21. Network 13 is connected to amplifier 9 by leads 10, 11 and 21'. Lead 11 controls a switching transistor 20 (FIG. 2) within network 13 whereas leads 10 and 21' are part of an energizing circuit supplying the detector stages 6 and 9 with operating voltage; lead 21' is an extension of conductor 21 which is one of the output leads of d-c source 4, 14. Components 6, 9, 12', 13 and 14 form part of a proximity sensor 1 of the general type described in my prior U.S. patents, particularly U.S. Pat. No. 3,932,803 whose disclosure is hereby incorporated by reference into the present application.

Figure 2:
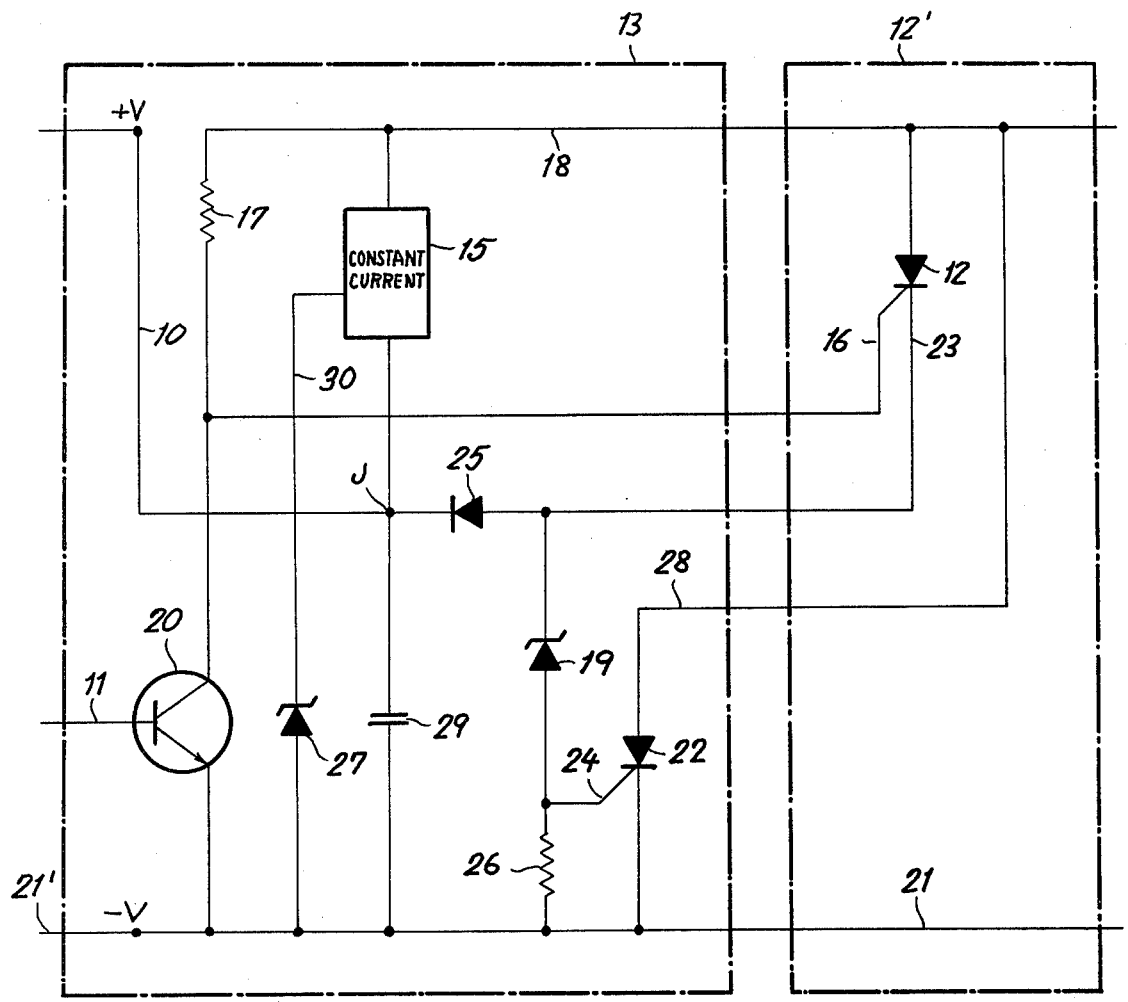
FIG. 2 is a more detailed circuit diagram of certain components of the system of FIG. 1, embodying the present invention.

In FIG. 2 I have shown only the components 12' and 13 of the system of FIG. 1 since the others conform to the illustration of U.S. Pat. No. 3,932,803. Component 12' comprises an ancillary thyristor 12 with an anode tied to positive supply lead 18 carrying pulsating voltage $+V$, a gate connected to a lead 16 and a cathode provided with a lead 23. Component 13 includes an NPN transistor 20 which, as in that prior patent, has its collector connected to gate lead 16 and also, through a resistor 17, to positive lead 18; its emitter is tied directly to negative supply lead 21 while its base is joined to lead 11 which is normally driven positive by oscillator 6 so that gate lead 16 is practically at voltage $-V$, maintaining the thyristor 12 in its nonconductive state.

A storage capacitor 29, inserted between leads 10 and 21, supplies operating current to components 6 and 9. Capacitor 29 lies in series with a constant-current unit 15 of the type described in U.S. Pat. No. 3,932,803, connected to supply lead 18. The junction J of current limiter 15 and capacitor 29 is connected through a decoupling diode 25 to the cathode lead 23 of thyristor 12.

A main thyristor 22 shunts the series combination of current limiter 15 and capacitor 29 by having its anode tied to lead 18 and its cathode joined to lead 21; a gate lead 24 of thyristor 22 is connected to lead 23 through a Zener diode 19 and to lead 21 through a stabilizing resistor 26.

In accordance with my present invention, and in contrast to the system described and claimed in my copending application Ser. No. 782,400 referred to above in which the charging voltage of capacitor 29 is limited by a Zener diode connected thereacross, such a Zener diode 27 is here shown connected between supply lead 21 and a control input 30 of constant-current unit 15. As more particularly illustrated in FIG. 3, such a unit 15a includes an output transistor 41 of NPN type having its collector tied to positive supply lead 18 and having its emitter connected to junction J through a resistor 46, transistor 41 and resistor 46 being shunted by a voltage divider comprising a resistor 43 in series with a Zener diode 44. The base 42 of transistor 41 is connected to a tap of the voltage divider represented by the junction of impedance elements 43 and 44, the potential of this junction being held constant with reference to junction J by the Zener diode 44 as long as the charge-limiting Zener diode 27 (FIG. 2) is nonconductive. Since the voltage drop across the base/emitter path of transistor 41 is also substantially constant, the current flowing through transistor 41 is essentially stable provided that the voltage on lead 18 is high enough (e.g. upward of 40V) to saturate that transistor.

When Zener diode 27 breaks down, input lead 30 is held at a fixed potential (e.g. of about 6V) with reference to that of leads 21, 21' so that the voltage difference between the base 42 and the emitter of transistor 41, which is biased through resistor 46 by the charging voltage of capacitor 29, progressively diminishes as long as the current flowing into the capacitor exceeds the current drawn by components 6 and 9. This also cuts off the Zener diode 44 whereby unit 15 passes only a residual charging current besides the small sustaining current for Zener diode 27 traversing the resistor 43.

Figure 4A:
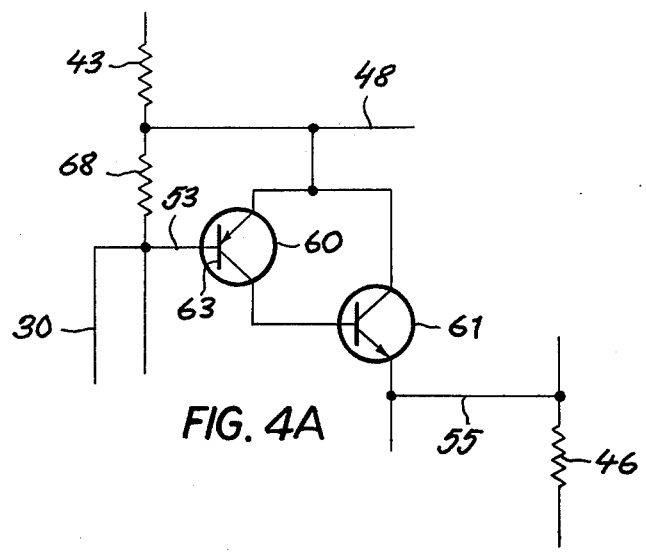
FIG. 4A is a fragmentary circuit diagram illustrating a variant of the arrangement of FIG. 4.
Figure 4:
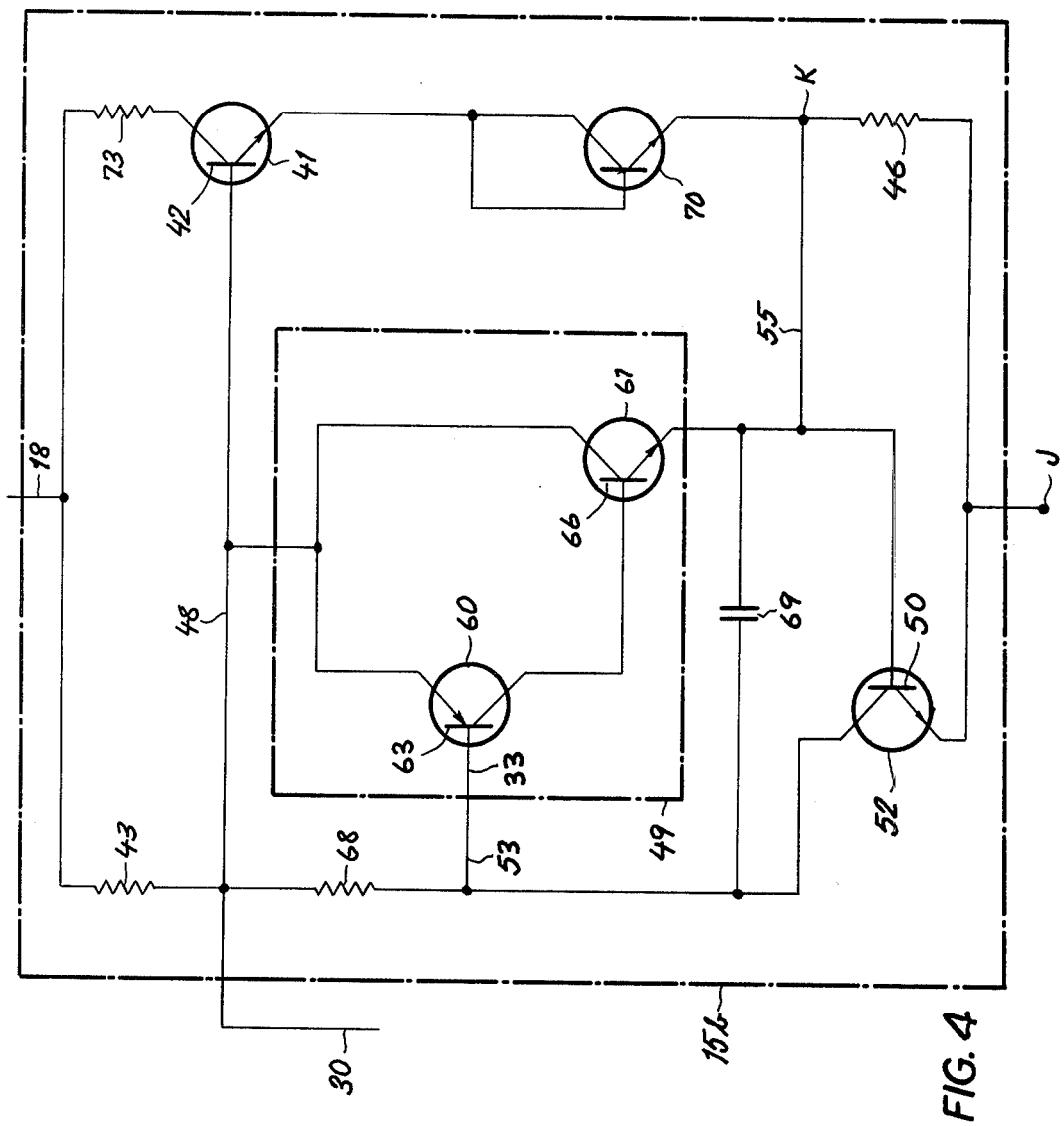
FIGS. 3 and 4 are circuit diagrams of two constant-current units substantially as shown in my prior patent No. 3,932,803, modified in conformity with this invention.
Figure 3:
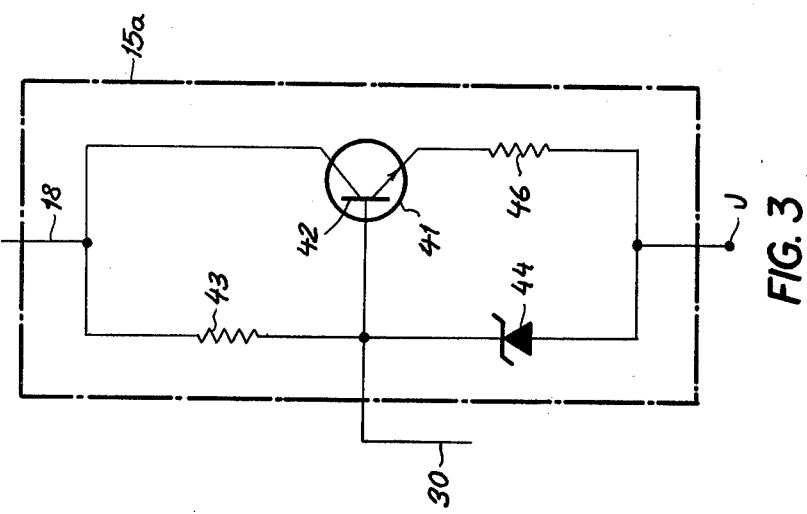

In FIG. 4 I have shown another constant-current unit 15b wherein the emitter resistor 46 of transistor 41 is connected across the base 50 and the emitter of an ancillary transistor 52 replacing the Zener diode 44 of the voltage divider of FIG. 3; the collector of transistor 52 is connected to resistor 43 through another resistor 68. Furthermore, a transistorized shunt circuit 49 is connected across part of the voltage divider 43, 68, 52, this shunt circuit including a supply connection 48 tied to the base lead 42 of transistor 41, an input connection 53 extending from the collector of transistor 52, and an output connection 55 extending to a junction K on the emitter side of the resistor 46 and to the base 50 of transistor 52.

A damping capacitor 69 bridges the collector and the base of transistor 52. Transistor 41 is provided with a protective collector resistor 73 and has its emitter connected to resistor 46 through a threshold-responsive diode 70 represented by an NPN transistor having its base returned to its collector.

Shunt circuit 49 comprises two complementary transistors in tandem, namely a PNP transistor 60 and an NPN transistor 61. Transistor 60 has an emitter tied to lead 48, a base 63 tied to lead 53 and a collector tied to the base 66 of transistor 61 whose collector is joined to lead 48 and whose emitter is joined to lead 55.

As further shown in FIG. 4, the control input 30 of constant-current unit 15b is again tied to the base lead 42 of transistor 41 and also to a tap of the voltage divider here represented by branch 43, 68, 52. The operation of this unit in the nonconductive state of Zener diode 27 has been fully described in my prior U.S. Pat. No. 3,932,803. When Zener 27 breaks down, the voltage of base 42 of transistor 41 is again stabilized to throttle the flow of charging current through branch 73, 41, 70, 46.

It will be understood that the threshold voltage of Zener diode 27 should exceed the desired maximum voltage of storage capacitor 29 by the substantially constant voltage drop which normally (i.e. in the nonconductive state of that Zener) exists between control input 30 and junction J.

As illustrated in FIG. 4A, the cathode lead 30 of Zener diode 27 (FIG. 2) can also be connected to the base 63 of transistor 60, via lead 53, rather than to the base 42 of transistor 41. In this instance the comparison transistor 61 acts as an emitter-follower limiting the conduction of transistor 60.

As long as thyristor 12 (FIG. 2) is cut off, thyristor 22 also remains nonconductive. During each half-cycle of a-c source 4 (FIG. 1), enough current passes the device 15 to charge the capacitor 29 to the breakdown voltage of Zener diode 27 in order to keep oscillator 6 and amplifier 9 operating. When the oscillator detects the approach of a metallic element, lead 11 is driven negative and blocks the transistor 20 whereupon lead 16 goes positive and triggers the thyristor 12. The current now traversing this thyristor, passed by the diode 25, replenishes the charge of capacitor 29 at the beginning of the next half-cycle and, before Zener diode 27 conducts, breaks down the Zener diode 19 whose threshold is lower than that of diode 27. This action ignites the thyristor 22 which now short-circuits the remainder of the supply network shown in FIG. 2 and causes the flow of a large load current through the relay 5 (FIG. 1) which operates to indicate the response of detector 6, 9. Aside from rectifier 14 and the internal resistance of source 4, only the small resistance of the conductive thyristor 22 lies at this point in series with the load.

Relay 5 may be sufficiently slow-releasing to remain operated between current pulses when thyristors 12 and 22 are both cut off. If the detected off-normal condition persists, the thyristors are sequentially retriggered at the beginning of the next half-cycle with brief recharging of capacitor 29 through diode 25 just before the firing of thyristor 22.

I claim:
1. An electronic monitoring system comprising:
   detector means sensitive to an ambient condition for generating an output signal varying with a change in said condition, said detector means being provided with a pair of power-input terminals;
   a voltage-generating network including a storage capacitor and a constant-current unit in series therewith, said terminals being connected across said storage capacitor in an energizing circuit for said detector means;
   a source of direct current with a pair of output leads connected across said network for charging said storage capacitor via said constant-current unit, one of said output leads having an extension included in said energizing circuit;
   a current-responsive load in series with said source and said constant-current unit;
   voltage-controlled variable-impedance means connected in shunt with at least part of said network across said source in series with said load;
   electronic control means coupled to said detector means and connected to said variable-impedance means for altering the conductivity thereof in response to changes in said output signal, thereby modifying the flow of current through said load with maintenance of a sufficient voltage drop across said storage capacity to keep said detector means operative; and
   an electronic breakdown device connected between said one of said output leads and a control input of said constant-current unit for throttling the flow of charging current into said storage capacitor while drawing a reduced sustaining current from a section of said constant-current unit, lying between said control input and the other of said output leads, upon said storage capacitor reaching a predetermined charging voltage.

2. A system as defined in claim 1 wherein said constant-current unit comprises two parallel branches, one of said branches including a current regulator provided with said control input, the other of said branches including a voltage divider with a tap connected to said control input for supplying said sustaining current through part of said voltage divider.

3. A system as defined in claim 2 wherein said current regulator comprises a transistor with an emitter connected to said one of said leads, a collector connected to said other of said leads and a base connected to said tap, said base constituting said control input.

4. A system as defined in claim 1 wherein said variable-impedance means comprises a first electronic control device having a pair of main electrodes respectively tied to said leads and further having an input electrode and an operating circuit for said first control device inserted between one of said leads and said input electrode, said operating circuit including a second electronic control device with input circuitry connected to said electronic control means.

5. A system as defined in claim 4 wherein said first and second control devices are a first and a second binary three-electrode switch.

6. A system as defined in claim 5 wherein said main electrodes are an anode and a cathode, said input electrode being a gate, said electronic breakdown device being a first Zener diode, said operating circuit further comprising a second Zener diode inserted in series with said second binary switch between said anode and said gate for becoming conductive upon a triggering of said second binary switch by said detector means to fire said first binary switch.

7. A system as defined in claim 6, further comprising a stabilizing resistor inserted between said gate and said cathode in series with said operating circuit.

8. A system as defined in claim 6, further comprising an ancillary charging circuit for said storage capacitor including a decoupling diode connecting said second binary switch in series with said storage capacitor.

9. A system as defined in claim 5 wherein said source comprises an alternating-current supply and rectifier means in series therewith for delivering a pulsating direct current to said network whereby said first and second binary switches are cut off at the end of any pulsation during which they are rendered conductive.

10. A system as defined in claim 5 wherein said binary switches are thyristors.

* * * * *